Figure 1:
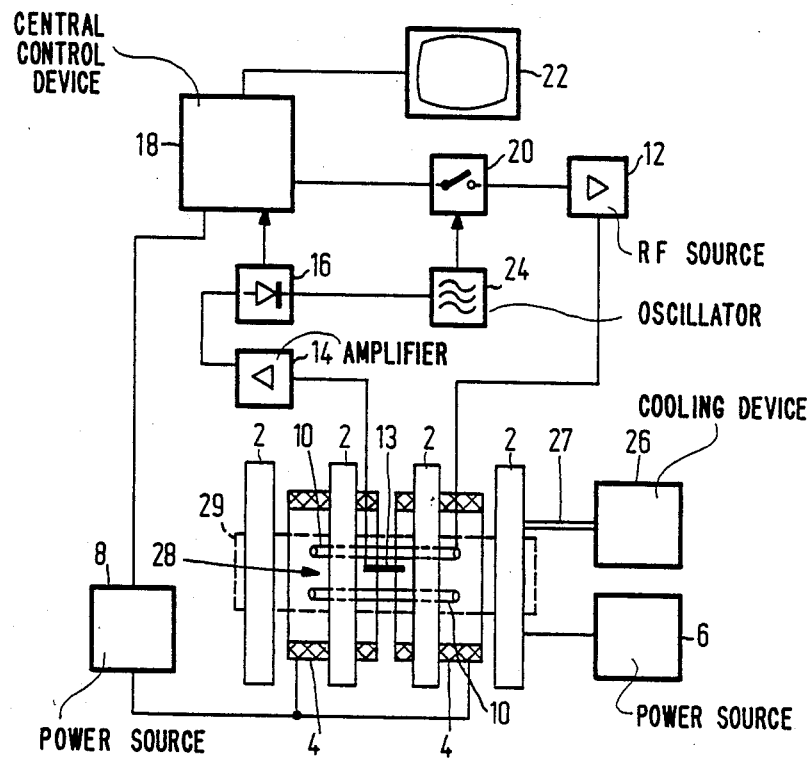

United States Patent [19]
Boskamp

[11] Patent Number: 4,839,595
[45] Date of Patent: Jun. 13, 1989

[54] MAGNETIC RESONANCE APPARATUS WITH A DECOUPLING DETECTION SURFACE COIL

[75] Inventor: Eddy B. Boskamp, Eindhoven, Netherlands

[73] Assignee: U.S. Philips Corporation, New York, N.Y.

[21] Appl. No.: 232,548

[22] Filed: Aug. 12, 1988

Related U.S. Application Data

[63] Continuation of Ser. No. 908,464, Sep. 17, 1986, abandoned.

[30] Foreign Application Priority Data

Sep. 25, 1985 [NL] Netherlands ................. 8502612

[51] Int. Cl.⁴ ................................. G01N 24/02
[52] U.S. Cl. ............................................. 324/318
[58] Field of Search ........... 324/307, 311, 314, 318, 324/322; 335/299; 336/171, 181, 226, 227, 232; 128/653; 333/219

[56] References Cited

U.S. PATENT DOCUMENTS

| | | | |
|---|---|---|---|
| 2,550,668 | 5/1951 | Gossick | 336/181 |
| 4,398,149 | 8/1983 | Zens | 324/300 |
| 4,602,234 | 7/1986 | Butson | 335/299 |
| 4,658,229 | 4/1987 | Chen et al. | 335/299 |
| 4,724,389 | 2/1988 | Hyde et al. | 324/316 |
| 4,725,779 | 2/1988 | Hyde et al. | 324/318 |

FOREIGN PATENT DOCUMENTS 1103132  7/1984  U.S.S.R. ........................... 324/307

Primary Examiner—Michael J. Tokar
Assistant Examiner—Lawrence G. Fess
Attorney, Agent, or Firm—Thomas A. Briody; Jack E. Haken; Jack D. Slobod

[57] ABSTRACT

A surface coil used as a measuring coil in a magnetic resonance apparatus is divided into at least two coil portions having opposite directions of winding and enclosing two identical surface areas. An induction current generated in a coil portion by a transmission field is then always compensated for by a current generated in the other coil portion. When one or more of such butterfly coils are used no circuits to block interfering signals need be built into the electronic measuring circuit and the transmission field is not disturbed by the measuring coil.

8 Claims, 2 Drawing Sheets

MAGNETIC RESONANCE APPARATUS WITH A DECOUPLING DETECTION SURFACE COIL

This is a continuation of application Ser. No. 908,464, filed Sept, 17, 1986, now abandoned.

The invention relates to a magnetic resonance apparatus with a magnet for producing a stationary magnetic field, an RF transmitting coil, an RF measuring coil in the form of a surface coil and electronic switching circuits for RF excitation and detection.

An apparatus of this kind is known from Nature No. 283, 1980, pp. 167–170. In the version described there, problems are encountered because, on the one hand, the transmitting coil sets up relatively strong currents in the measuring coil against which currents the RF detection circuit has to be protected and, on the other hand, an activated measuring coil disturbs the homogeneity of the transmitting field.

The invention is intended to overcome these drawbacks and, to that end, the magnetic resonance apparatus of the kind stated in the preamble is characterized by the fact that the measuring coil has such a geometry that electromagnetic coupling between the transmitting coil and the measuring coil is avoided.

Since, in an apparatus according to the invention, the geometry of the measuring coil impedes the induction of currents in it by the transmitting coil, the undesired effects refered to do not occur here, even without blocking arrangements in the detection circuit.

In a preferred implementation the measuring coil comprises two portions situated in a flat plane with windings orientated in opposite directions to each other and enclosing equal surface areas.

In both a linear and a rotating spatially homogeneous transmitting field, with such an arrangement a current induced in a first coil half will always be compensated by a current induced in the second coil half and therefore no EMF will be generated at the input terminals of the coil. There are no restrictions with respect to the orientation of the surface coil. It will always be decoupled from a homogeneous RF excitation field.

In a further form of the invention, the measuring coil is roof-shaped with the separation between the two coil parts coinciding with the ridge of the roof. A coil of this kind cannot be used for a rotating transmitting field but can have advantages for a linear transmitting field because the measuring area can be adapted to the shape of the object. For both a linear and a rotating transmitting field, the two coil parts can also be arranged one above the other. In that case a minimum spacing between them will have to be observed in order to enable the measuring signals to be detected. This spacing can again be adapted to an object which has to be positioned between the two coil parts.

In a further preferred form of the invention, the coil comprises more than two, for example three, coil portions whose total surface area can be divided into two equal parts by at least one axis of symmetry, the sum of the surface area of a first set of coil portions being equal to the sum surface area of a seocnd set of coil portions.

Two or more such coils may also be used in an apparatus, in which case the orientation in relation to the transmission field is chosen so that maximum measuring sensitivity occurs for an area enclosed by the coils, subject to current compensation in the coils.

Some preferred embodiments of the invention will now be further described with reference to the drawings. In the drawings:

FIG. 1 shows a schematic diagram of a magnetic resonance apparatus equipped with a divided surface coil as its measuring coil, FIGS. 2a–d shows examples of surface coils for that purpose.

A magnetic resonance apparatus such as shown in FIG. 1 comprises a system of magnets for the production of a steaady, homogeneous magnet field, a magnetic system 4 for the production of magnetic gradient fields, power sources 6 and 8 for the magnet system 2 and the magnet system 4, respectively. The magnetic coil 10 used for producing an RF magnetic alternating field is connected to a radio-frequency source 12. A surface coil is used for detecting magnetic-resonance signals generated by the RF transmission field in an object to be studied. For read-out, coil 13 is connected to a signal amplifier 14. The signal amplifier 14 is connected to a phase-sensitive rectifier 16 which is connected to a central device 18. The central control device 18 drives a modulator 20 for the radio-frequency source 12, the power-supply source 8 for the gradient coils and a monitor 22 for image display. A high-frequency oscillator 24 controls both the modulator 20 and the phase-sensitive rectifier 16 which processes the measuring signals. For cooling, where necessary, the cooling device 26 with cooling slines 27 is used. A cooling device of this kind may use water for cooling of resistance coils or a liquid-helium Dewar system for cooling superconductive coils. The transmitting coil 10 located between the magnet systems 2 and 4 encloses an examinaqtion space 28, which, in an apparatus for diagnostic medical measurements is large enough to accommodate patients. The stationary magnetic field, gradient fields for position selection of layers to be imaged and a spatially homogenous radio-frequency alternating field have thus to be generated in the examination area 28. The surface coil, preferably positionable, is installed within the area 28. For certain examinations such as that of dorsal vertebrae it may be advantageous to incorporate the coil in a table-top for the patient, which table-top, not shown, can be moved axially in the examination space and is adjustable radially. A measuring coil can also be installed in such a way that it can be adjusted for the part of the body to be examined. Such a coil is then preferably in fact coupled to the patient during the performance of the examination and moves with the patient when he/she is re-oriented.

Figure 2A:
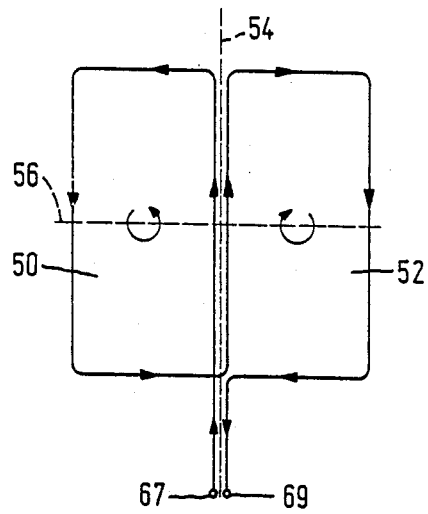

The surface coil, as shown in FIG. 2a, comprises two constituent turns 50 and 52 with mutually opposite directions of current, as indicated by the arrows. If a magnetic flux, generated, for example, by a transmitting coil, is passed through one of the constituent turns and a current is therefore generated, the latter is compensated by the current in the opposite direction generated in the other coil portion. If coil portions are identical and, in particular, have an identical effective surface area, which as used here means enclosing the projection of the surface areas transverse to the direction of the transmission field, the flux captured in both coil parts will be equal as long as the field generating the flux is spatially homogenous. "Spatially homogeneous" is defined here as being equal in strength and direction at every moment in the relative space. For the operation of the invention it is therefore, subject to the above-mentioned condition, less relevant how the divided coil is oriented in the transmission field. The orientation may, however, be important for the size of an area to be measured effectively by the measuring coil. From measurements of the field of the coil it is possible, on the basis of the reciprocity principle applying here, to determine how far an effective measurement field of the coil extends. For a more general survey of the situation, see an article in "Journal of Magnetic Resonance", 62, 1985, pp. 397–405.

In magnetic resonance apparatus two or more measuring coils are frequently used for one measurement, e.g. on a specific part of the body. Good use can then also be made of surface coils according to the invention. In that case the coils are arranged in such a way, in relation to the object to be studied and in relation to each other, that the most favourable measuring-signal resonance occurs for an enclosed measuring area. For examination of a knee, for example, four surface coils can be grouped around the knee in a regular rectangle with an axis of symmetry of each of the divided coils lying in the x-y plane with a transmission field orientated in the z direction.

Figure 2B:
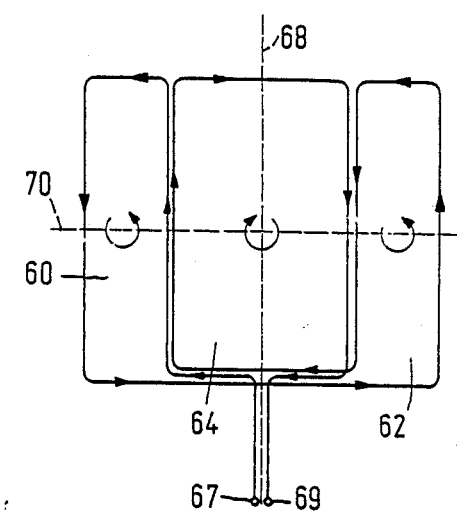

FIG. 2b shows an example of implementation of a surface coil consisting of three coil portions 60, 62 and 64. The surface area of coil portion 64 is here equal to the sum of the surface areas of coil portion 60 and 62 and the direction of the induced current is indicated with by the arrows. With an orientation in a transmission field with one of the axes of symmetry 68 and 70 in a plane transverse to the transmission field between terminals 67 and 69 no EMF will again be generated.

Figure 2C:
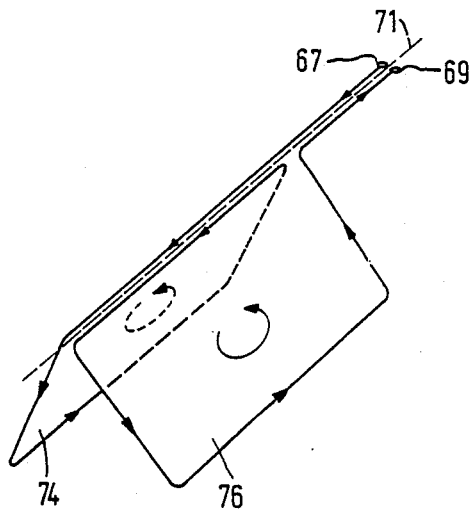

In an apparatus operating with a directionally stationary transmission field the two identical surface-area portions need not lie in one plane but a roof shape in accordance with, for example. FIG. 2c is also permissible, The ridge of the roof defines a line of symmetry 71 in a plane transverse to the transmission field and the two parts 74 and 76 of the roof are orientated at similar angles to a transmission field. It is therefore also possible to work in similar fashion with a coil which encloses a part of a cylindrical sheath as surface area. In the coil shown in FIG. 2a lines 54 and 56 can act as axes of symmetry. For effective operation with a transmission field directed transversely to the plane of the drawing, one of these axes of symmetry will lie in the plane of the drawing but the coil can be set up rotated round that axis, i.e. round one of the two, as desired.

Figure 2D:
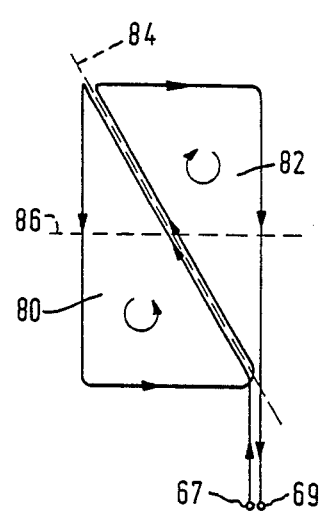

FIG. 2d shows a surface coil in which a coil surface is divided diagonally into two identical surface-area portions 80 and 82. Here, too, two axes of symmetry 84 and 86 can be said to exist to which the condition specified above apply. Considered geometrically, the axes of symmetry 84 and 86 are different in character from the axes of symmetry already mentioned but that is not relevant to a spatially homogeneous transmission field.

In the preceding examples rectangular coil surface areas have in many cases been assumed but it will already be clear from the description that it is also possible to have circular surface areas which are divided along a diameter. As long as the symmetry requirements are met, it is particularly the size and geometry of the part of the object from which signals are detected by the measuring coil with a satisfactory signal-to-noise ratio which determine the shape.

What is claimed is:

1. A magnetic resonance apparatus comprising means for generating a stationary magnetic field in an examination space, an RF transmission coil for producing an RF magnetic field in said examination space, a separate RF measuring coil for detecting magnetic resonance signals produced by said RF field in an object disposed in said examination space, said measuring coil comprising at least two, planar coil portions each disposed on opposite sides of an axis of symmetry which divides said coil so that sum of the surface area of the coil portions on the respective sides of said axis are substantially equal, all coil portions on a respective side of said axis of symmetry lying in a single plane and being oriented with respect to the direction of the transmission field so that a current induced by said RF field in the coil portion on one side of said axis is compensated for by a current induced by said RF field in the coil portion on the other side of said axis to thereby reduce coupling between said transmission coil and said measuring coil.

2. The apparatus according to claim 1 wherein said measuring coil has two rectangular coil portions having equal surface areas.

3. The apparatus according to claim 1 wherein said measuring coil is rectangular and said axis of symmetry extends between two diagonally opposite corners of said rectangular coil so as to divide said measuring coil into two triangular coil portions.

4. The apparatus according to claims 1, 2 or 3 wherein all of said coil portions of said measuring coil lie in a single plane.

5. The apparatus according to claim 1 wherein said coil portions on each side of said axis lie in respective planes which are inclined with respect to each other so as to form a roof shape with said axis of symmetry extending along the ridge thereof.

6. The apparatus according to claim 1, 2, 3 or 5 comprising two or more of said measuring coils.

7. The apparatus according to claim 1, 2, 3 or 5 wherein said measuring coil is oriented so that said axis of symmetry is transverse to the direction of the transmission field.

8. The apparatus according to claim 1 wherein as seen from the direction of the transmission field, said measuring coil forms a regular polygon.

* * * * *